United States Patent [19]

Böttcher

[11] 4,179,667

[45] Dec. 18, 1979

[54] CIRCUIT ARRANGEMENT FOR ADJUSTING THE VOLUME OF AN AUTOMOBILE RADIO RECEIVER IN DEPENDENCE ON ROAD NOISE

[76] Inventor: Peter Böttcher, Tannenbergalee 4C, D-3000 Hanover 1, Fed. Rep. of Germany

[21] Appl. No.: 871,835

[22] Filed: Jan. 24, 1978

[30] Foreign Application Priority Data

Jan. 27, 1977 [DE] Fed. Rep. of Germany ....... 2703249

[51] Int. Cl.² .............................................. H03F 1/26
[52] U.S. Cl. .................................. 330/149; 325/406; 330/141; 330/281
[58] Field of Search ................ 325/406; 330/141, 149, 330/280, 281, 284

[56] References Cited

U.S. PATENT DOCUMENTS

| | | | |
|---|---|---|---|
| 2,409,058 | 10/1946 | Mitchell | 325/406 |
| 2,501,327 | 3/1950 | Good | 325/406 X |
| 3,021,489 | 2/1962 | Nielsen | 330/281 |

FOREIGN PATENT DOCUMENTS 2525175  12/1976  Fed. Rep. of Germany ...... 330/149 X

*Primary Examiner*—Lawrence J. Dahl
*Attorney, Agent, or Firm*—Allegretti, Newitt, Witcoff & McAndrews

[57] ABSTRACT

The invention relates to a circuit arrangement for adjusting the volume of an automobile radio receiver in dependence on road noise, comprising a microphone which picks up the noise and emits an electric signal which is conducted by way of an amplifier, a rectifier and a time-controlled circuit, to a control-adjustment member contained in the low frequency channel of the receiver.

7 Claims, 1 Drawing Figure

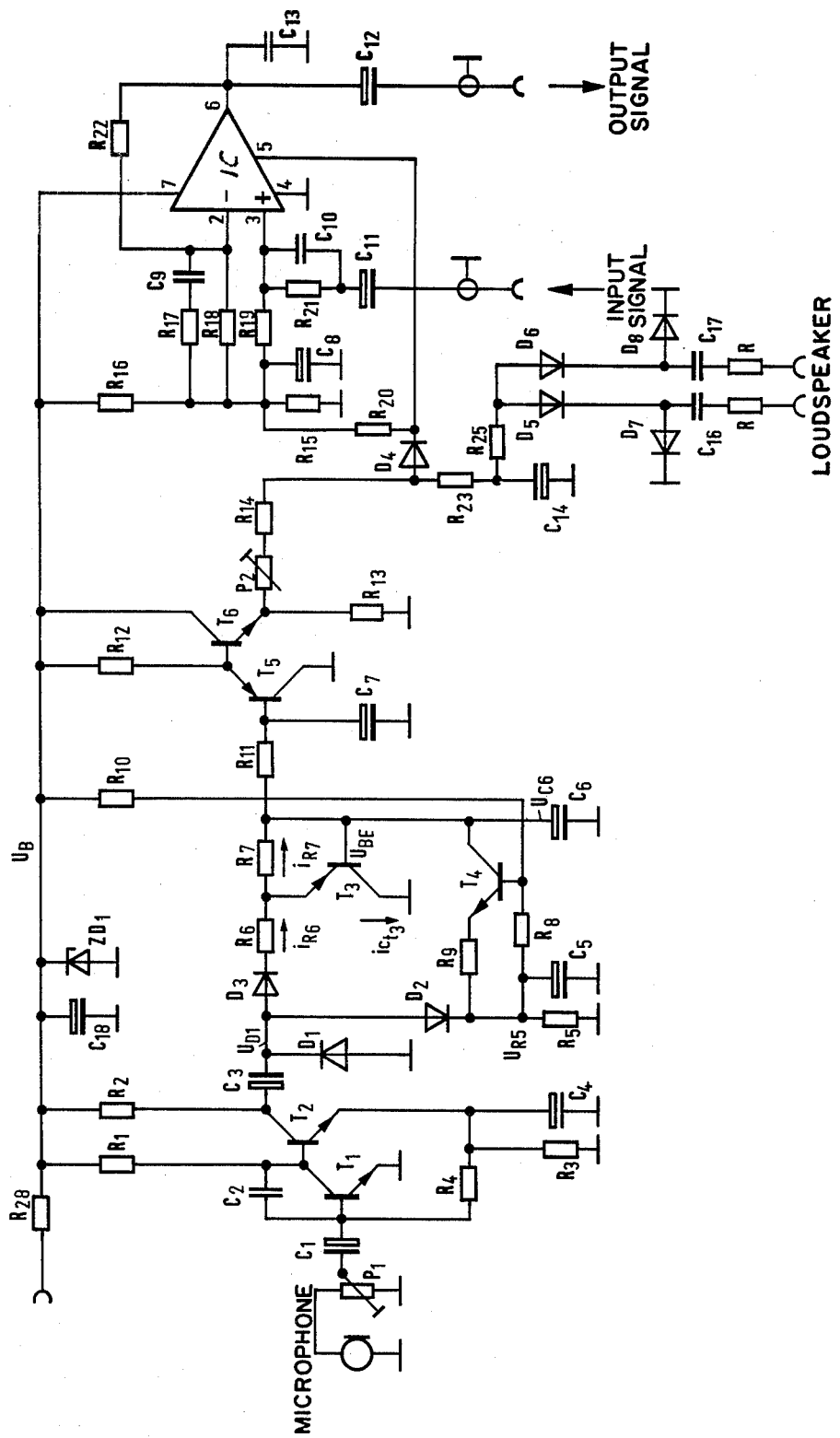

CIRCUIT ARRANGEMENT FOR ADJUSTING THE VOLUME OF AN AUTOMOBILE RADIO RECEIVER IN DEPENDENCE ON ROAD NOISE

The periodical ELEKTOR, June 1974, page 29, discloses a circuit arrangement for controlling the volume of a car radio, in which a signal from a crystal microphone arranged under the engine hood is amplified and rectified to control the amplification of an amplifier contained in the low freaquency channel. The degree of amplification always follows immediately the detected noise level. This is not very advantageous because when brief variations of noise level occur the volume of the receiver immediately follows the variations; hence during travel, particularly in city traffic, the sound intensity of the receiver constantly fluctuates.

The periodical ELEKTRONIKPRAXIS, No. 5, May 1976, page 104, discloses a circuit for a noise-controlled adjustment of the sound intensity of an automobile radio, in which a circuit is constructed in principle like the circuit previously described but contains a time function element disposed in the path of the rectified output signal of the microphone and which has a time constant of about 10 seconds. The time function element consists essentially of an RC circuit combination, so that the controlled adjustment takes place substantially according to the e-function of the RC combination. This has the disadvantage in that sudden considerable variations of noise level cause a sudden change in the sound intensity of the receiver. It has been found in practice that this is a disadvantage and disturbs the driver. In addition, a disadvantage exists in that because of the e-function of the RC-member, the speed of the controlled adjustment decreases as the actual sound intensity at any given moment increasingly approaches the desired sound intensity. This means, that because of the large time constant which is identical both for increased volume and for reduced volume adjustment, the volume which is per se desirable at any given moment is achieved only with considerable delay. This is likewise a disadvantage in practice on account of known overlap effect, as a result of which the information reproduced by the loudspeaker is overlapped by the interference even with slight differences in level, and thus is considerably impaired, it is desirable to have the quickest possible adjustment of the reproduction volume in proportion to the noise level.

The problem underlying the invention is that of providing a circuit arrangement for adjusting the sound intensity of an automobile radio receiver according to travel noise, in which the disadvantages of the known circuits are eliminated; that is, to cause such an adjustment of the reproduction volume as a function of the detected disturbing noise so that the driver is not bothered with the annoying rapid adjustments when rapid changes in the noise level occur; and it is nevertheless ensured that when fluctuations in noise level do occur, there is as little a loss in reproduction information as possible.

The problem is resolved whereby a time controlled circuit having essentially a linear characteristic serves as the foundation of the invention.

This linear characteristic of the time-controlled circuit means that the speed of adjustment is constant when the actual value of the volume reproduced does not conform to the desired value determined per se by the detected noise level. On the basis of the linear characteristic as compared with the hitherto known adjustment corresponding to an e-function, there ensues in the starting region a slower adjustment while in the end region an increasingly rapid adjustment is effected, so that the final value is achieved in a time prescribed, for example, by the time constant, so that the actual and desired values of the reproduced volume fully coincide. In a system based on an e-function, this coincidence is achieved never in theory and only vary late in practice particularly since continuous fluctuations in the noise level must be assumed.

The practical development of the time-controlled timing circuit of the type described wherein essentially a linear characteristic is attained, is possible in various ways, some of which are known per se to the expert. An appropriate possibility consists wherein the time-dependent circuit is provided with a capacitor, which is charged via a component of high internal resistance for supplying a constant current.

Due to a constant charging current a substantially linear rise of the charging voltage of the capacitor results. In this connection, it is necessary to ensure that when the desired and actual values of the reproduced volume coincide, the charging or discharging is terminated.

It is appropriate to utilize as a component a transistor which permits charging with a constant current, and at the same time permits a complete termination of the charging or discharging on the basis of its known characteristic.

If the component is a large ohmic resistor for the termination of the charging when the desired and actual values of reproduced volume coincides, this resistor is connected in series with a switch which is operated in dependence on the difference between the electrical signal dependent on the noise level and the low frequency output voltage of the receiver, that is to say, which opens and terminates the charging or discharging when the desired and actual values coincide.

A particularly practical further development of the invention, which per se is patentable, consists wherein the time controlled circuit possesses two different timing elements, one of which is effective in the case of an increase of the electrical signal dependent on the noise level, and the other of which is effective in the case of a falling in the same. This means in practice, that the reproduced volume of the receiver in the case of an increase in the noise level, is adjusted with a speed other than a speed in the case of a drop in the noise level. Thereby, unnecessary variations in the volume and unnecessary annoyances for the listener are avoided, while at the same time a loss in the reproduced information is avoided. This has been confirmed by practical experiments carried out.

A further development of the invention consists wherein the characteristic of the time-controlled circuit is not linear in the starting region, so that a threshold is formed which effects a delayed commencement of the adjustment. A delayed commencement of the adjustment has the effect that despite the advantageous rapid adjustment to the best value at any given moment, which per se is possible, unnecessary short adjustments based on brief variations of the noise level are avoided where these variations of noise level are maintained within narrow limits, which are determined by the magnitude of the adjusted threshold.

Finally, there exists a feasible further development wherein the time-controlled circuitry acts more sharply on the control element in the case of higher frequencies of the frequency band in the low frequency channel, than in the case of lower frequencies. This means that with the rising control voltage there is an additional high frequency emphasis.

The invention will be further explained by reference to an example of a circuit illllustrated in the drawing.

The signal transmitted by a microphone 1, which picks up interference in the motor vehicle, is conducted by way of a potentiometer $P_1$ and a capacitor $C_1$ to a transistor $T_1$, with which a transistor $T_2$ is voltage-coupled. The operational point of the amplifier thus constructed, is stabilized by way of a resistor $R_4$. Both transistors $T_1$ and $T_2$ are fed through resistors $R_1$ and $R_2$ which lead to a supply line carrying the voltage $U_B$.

An amplified signal transmitted by transistor $T_2$, is rectified by means of a clamping stage formed by a capacitor $C_3$ and a diode $D_1$ to form a voltage $U_{D1}$ which is always positive.

Signal $U_{D1}$ passes via a diode $D_3$ to a charging stage consisting of resistors $R_6$ and $R_7$, and a Transistor $T_3$, for a capacitor $C_6$ whose charging voltage is designated $U_{C6}$.

$R_7$ and $T_3$ constitute a constant current source for the capacitor $C_6$. If the voltage drop at $R_7$, resulting from the charging current for the capacitor $C_6$, should exceed the base-emitter threshold voltage $U_{BE}$, the Transistor $T_3$ will open and through its emitter-collector path will divert sufficient current to ensure that $U_{BE}$ is not exceeded. This means that the voltage at $R_7$ is constant, and thus the current thru this resistor is also constant. Below this value the Transistor $T_3$ is to be regarded as non-existant. This applies for currents:

$i > U_{BE}/R_7$.

The Resistor $R_6$ serves only to supply a minimum input resistance for the charging stage described.

A charging operation starts when the voltage difference is positive, i.e. $U_{C6} < U_{D1}$. If this condition is not fulfilled then the case may arise that $U_{C6} = U_{D1}$. In this case nothing happens, i.e., $C_6$ is neither charged nor discharged.

If however $U_{C6} > U_{D1}$, then a discharge stage which is formed from a transistor $T_4$, resistors $R_5$, $R_8$, $R_9$, capacitors $C_5$ and $C_6$, and a diode $D_2$, comes into operation. Since the voltage at $D_1$ is not a direct current voltage, but rather the clamped alternating current voltage, it is first conducted by way of the diode $D_2$ to the parallel circuit of $C_5$ and $R_5$, at which the voltage $U_{R5}$ then exists, this voltage thus constituting a measurement of the instantaneous noise level. This direct current voltage $U_{R5}$ is utilized for comparison with the voltage $U_{C6}$.

With a voltage divider $R_{10} R_8$ between the feed voltages $U_B$ and $U_{R5}$, the reference voltage is produced for the current source (base voltage for $T_4$), which comprises the transistor $T_4$ and the resistor $R_9$. In this manner multiple dependence of the discharge current on $U_{R5}$ is obtained. If $U_{R5} < U_{C6}$, a discharge current flows by way of the collector-emitter path of $T_4$ and $R_9$, to $R_5$. The maximum current through $R_9$ is adjusted again in such a way that $U_{BE}$ is not exceeded, while the reference voltage at the base of $T_4$ depends on the difference between the voltages $U_B$ and $U_{R5}$ (by way of the Voltage Divider $R_8 R_{10}$), and, in addition, $U_{R5}$ is influenced by the discharge current from $C_6$ through $R_5$.

The voltage $U_{C6}$ is passed through a filter element $R_{11} C_7$ to the base of a transistor $T_5$, which is galvanically coupled to a transistor $T_6$ connected as an emitter follower. Both Transistors $T_5$ and $T_6$ are respectively PNP and NPN transistors.

The signal existing at the emitter of $T_6$ is the control voltage which is fed to a following control element via a potentiometer $P_2$ and a resistor $R_{14}$.

The control element comprises essentially an integrated amplifier IC whose output 6 is connected by way of a resistor $R_{22}$ to an inverting input 2. Maximum amplification is determined by the ratio of resistors $R_{22}$ and $R_{18}$.

A series connection of a resistor $R_{17}$ and a capacitor $C_9$ is connected in parallel to $R_{18}$. This provides a frequency dependant amplification in dependence on the divider ratio of the negative feedback network. In addition, the amplification is determined by the current in the control input 5. If this becomes so great that the open-loop gain exceeds the value given by the negative feedback network, this amplification is fully effective. Starting from this point the transmission ratio is frequency-dependent through the combination $R_{17} C_9$.

The inverting input 2 is connected via a resistor $R_{18}$ to a reference voltage which is formed by a voltage divider $R_{16} R_{15}$. This reference voltage is passed by way of a resistor $R_{19}$ to a non-inverting input 3 to which also the input signal is supplied through a capacitor $C_{11}$ and a resistor $R_{21}$. A capacitor $C_{10}$ serves for frequency compensation. The output of the amplifier IC is taken out by way of a capacitor $C_{12}$. The capacitor $C_{13}$ serves to suppress any possible vibrations.

The current for the basic amplification (minimal amplification) is supplied through a resistor $R_{20}$. If the voltage at the emitter of $T_6$ rises, then an additional current, whose magnitude is alterable by adjusting the potentiometer $P_2$, will flow by way of the potentiometer $P_2$, resistor $R_{14}$ and a diode $D_4$ into the control input 5. Since further dependence of the amplification on the volume actually adjusted is desirable, although in inverse proportion in this case, i.e., the louder the volume the less the adjustment, facilities are provided for reducing the current supplied for the amplification control $T_6$. This is done in the following manner.

The output voltage existing at the loudspeaker sockets is passed by way of $C_{16}$ and $C_{17}$ respectively and clamped at the diodes $D_7$ and $D_8$. The negative half-waves of the signal are passed via $D_5$, $D_6$ and by way of the resistor $R_{25}$ to the capacitor $C_{14}$. The voltage of this filter element is connected by way of a resistor $R_{23}$ and $D_4$ to the control input of the amplifier IC, the value of the resistance $R_{23}$ determining the magnitude of the current flowing off. Through the symmetrical input circuit for the voltage coming from the loud speaker, the subsequent connection to an existing receiver is facilitated.

I claim:

1. A circuit arrangement for adjusting the volume of an automobile radio receiver in dependence on road noise, comprising;
    microphone means for picking up noise and responsively producing an electrical signal having a magnitude value representative of the magnitude level of the noise;
    amplifier means for amplifying said electrical signal;
    rectifying means for rectifying the amplified signal;
    time-controlled circuit means responsive to the rectified signal for producing a time-dependent signal advancing in magnitude toward the instantaneous magnitude value of said rectified signal at a substantially linear rate, said time-controlled circuit means maintaining the magnitude of said time-dependent signal when the magnitude of said time-dependent signal equals the magnitude value of said rectified signal and control means positioned in the low frequency channel of the receiver for controlling the volume of the receiver, said control means responsive to the magnitude of said time-dependent signal.

2. A circuit arrangement according to claim 1, wherein said time-controlled circuit means includes capacitor means; and a current source for charging said capacitor means at a substantially linear rate, said time-controlled circuit means responsive to the difference between said instantaneous magnitude value of said rectified signal and the magnitude of the signal appearing across said capacitor means, for controlling the charging of said capacitor means, said time-controlled circuit means interrupting the charging of said capacitor means when said difference is zero.

3. A circuit arrangement according to claim 2 wherein said current source includes a transistor.

4. A circuit arrangement according to claim 2 and further including discharge means connected in series with said current source and for discharging said capacitor means at a substantially linear rate, said discharge means responsive to the difference between the magnitude of said rectified signal and the magnitude of the signal across said capacitor means.

5. Circuit arrangement according to claim 1 wherein said time-controlled circuit means includes a first and a second timing means, said first timing means effective during increase of the magnitude of said time-dependent signal for effecting increase of the magnitude of said time-dependent signal at a first substantially linear rate and said second timing means effective during decrease of the magnitude of said time-dependent signal for effecting decrease of said time-dependent signal at a second substantially linear rate, said first substantially linear rate different from said second substantially linear rate.

6. A circuit arrangement according to claim 1 wherein said time-controlled circuit means includes delay means providing a threshold level for delaying controlling of said control means.

7. A circuit arrangement according to claim 1 wherein said control means acts more strongly on the volume responsive to high frequencies of the radio frequency band transmitted in the low-frequency channel than at lower frequencies.

* * * * *